US009548045B2

(12) United States Patent
Kuo et al.

(10) Patent No.: US 9,548,045 B2
(45) Date of Patent: Jan. 17, 2017

(54) ANTI-NOISE HEADSET DEVICE AND SOUND PROCESSING METHOD THEREOF

(71) Applicant: AVerMedia TECHNOLOGIES, INC., New Taipei (TW)

(72) Inventors: Yan-Min Kuo, New Taipei (TW); Li-Yen Lin, New Taipei (TW)

(73) Assignee: AVERMEDIA TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 14/720,955

(22) Filed: May 25, 2015

(65) Prior Publication Data

US 2015/0348529 A1 Dec. 3, 2015

(30) Foreign Application Priority Data

May 27, 2014 (TW) ............................ 103118461 A

(51) Int. Cl.

*G10K 11/16* (2006.01)
*H03B 29/00* (2006.01)
*H04R 3/02* (2006.01)
*G10K 11/178* (2006.01)

(52) U.S. Cl.

CPC ..... *G10K 11/178* (2013.01); *G10K 2210/3016* (2013.01); *G10K 2210/3028* (2013.01); *G10K 2210/3033* (2013.01); *G10K 2210/3047* (2013.01); *G10K 2210/3048* (2013.01)

(58) Field of Classification Search

CPC ..... G10K 11/002; G10K 11/16; G10K 11/178; H04R 3/00; H04R 3/005; H04B 15/00
USPC ................ 381/71.6, 71.11, 71.8, 71.14, 73.1
See application file for complete search history.

(56) References Cited

U.S. PATENT DOCUMENTS 9,099,077 B2 * 8/2015 Nicholson .......... G10K 11/1782
2013/0083939 A1 * 4/2013 Fellers ................ G10K 11/178 381/71.11

FOREIGN PATENT DOCUMENTS

| | | | |
|---|---|---|---|
| CN | 201481447 | U | 5/2010 |
| TW | 423780 | U | 2/2001 |
| TW | 536097 | U | 6/2003 |
| TW | M254200 | U | 1/2005 |
| TW | 200843540 | A | 11/2008 |
| TW | M419360 | U1 | 12/2011 |
| TW | 201351396 | A | 12/2013 |

* cited by examiner

*Primary Examiner* — Thjuan K Addy
(74) *Attorney, Agent, or Firm* — CKC & Partners Co., LTD.

(57) ABSTRACT

An anti-noise headset device and a sound processing method thereof are provided. The anti-noise headset device includes an audio receiving module and a control module. The audio receiving module is configured to receive several audio signals in several periods. The control module is electrically coupled to the audio receiving module. The control module is configured to store the audio signals received from a first period to an Nth period as sound data. The control module compares the audio signal received in an (N+1)th period with the sound data so as to generate a relevance value, N is an integer larger than zero. When the relevance value is smaller than a threshold value, the control module filters out a portion of the audio signal received in the (N+1)th period, in which the portion of the audio signal received in the (N+1)th period is relevant to the sound data.

14 Claims, 2 Drawing Sheets

ANTI-NOISE HEADSET DEVICE AND SOUND PROCESSING METHOD THEREOF

RELATED APPLICATIONS

This application claims priority to Taiwanese Patent Application Serial Number 103118461, filed May 27, 2014, which is herein incorporated by reference.

BACKGROUND

Technical Field

The present disclosure relates to an anti-noise headset device. More particularly, the present disclosure relates to an anti-noise headset device for adaptively filtering out noise.

Description of Related Art

Usually, the conventional anti-noise headset device is configured to isolate the user from audios totally. Although the user can hear no noise by wearing the conventional anti-noise headset device, the user is unable to hear other sounds, too. However, in some occasions, it may result in an accident if the user is totally isolated from the received audios. For example, in the construction site, the user can be prevented from noise by wearing the conventional anti-noise headset device. However, when an emergency event happens, the user is also unable to hear the alarm immediately.

Moreover, the user also fails to talk with others when the user is isolated from noise by wearing the conventional anti-noise headset device. Since the use of the conventional anti-noise headset device is inconvenient and limited, an improved anti-noise headset device is provided. In the improved anti-noise headset device, some noise data are built-in previously. When the user wears the improved anti-noise headset device, it can filter out noise corresponding to the built-in noise data. Therefore, the user can hear other audios when the user is isolated from noise.

However, the use of the improved anti-noise headset device is still limited. For example, noise data must be built in the improved anti-noise headset device previously before the user wears it so that the improved anti-noise headset is able to filter out noise. Moreover, the built-in noise data is not adapted in every environment. In other words, the improved anti-noise headset device is able to operate only in some special occasions. When the environment is changed, the improved anti-noise headset device is unable to filter out noise corresponding to the changed environment. For example, the anti-noise headset device for aircraft includes built-in engine noise data. Therefore, the anti-noise headset device for aircraft is not adapted in the construction site or other noisy environments. Accordingly, the use of the improved anti-noise headset device is still inconvenient and limited.

SUMMARY

In order to solve the aforementioned problems, the present disclosure is to provide an anti-noise headset device and a sound processing method thereof. Through comparing a current audio signal with past audio signals so as to generate a relevance value, a determination is made as to whether the current audio signal is the background audio signal according to whether the relevance value is larger than or equal to a threshold value. Therefore, the anti-noise headset device can filter out noise signal effectively in any occasions.

One aspect of the present disclosure is to provide an anti-noise headset device. The anti-noise headset device includes an audio receiving module and a control module.

The audio receiving module is configured to receive several audio signals in several periods. The control module is electrically coupled to the audio receiving module. The control module is configured to store the audio signals received by the audio receiving module from a first period to an Nth period as sound data. The control module compares the audio signal received in an (N+1)th period with the sound data so as to generate a relevance value, in which N is an integer larger than zero. When the relevance value is smaller than a threshold value, the control module filters out a portion of the audio signal received in the (N+1)th period, in which the portion of the audio signal received in the (N+1)th period is relevant to the sound data.

According to one embodiment of the present disclosure, when the relevance value is larger than or equal to the threshold value, the control module adds the audio signal received in the (N+1)th period into the sound data.

According to one embodiment of the present disclosure, when the relevance value is larger than or equal to the threshold value, the control module deletes the audio signal received by the audio receiving module in an earliest period in the sound data.

According to one embodiment of the present disclosure, the control module includes a store unit and a digital signal processing unit. The digital signal processing unit is electrically coupled to the store unit. The digital signal processing unit is configured to execute an audio characteristic analysis for the audio signals received by the audio receiving module so as to obtain several audio characteristics of the audio signals. The digital signal processing unit stores the audio characteristics of the audio signals received from the first period to the Nth period as the sound data. The digital signal processing unit stores the sound data in the store unit and compares the audio characteristic of the audio signal received in the (N+1)th period with the sound data so as to generate the relevance value.

According to one embodiment of the present disclosure, the control module further includes an audio filtering unit electrically coupled to the digital signal processing unit. The audio filtering unit is configured to generate an anti-noise data and to superimpose a ratio of the anti-noise data onto the audio signal received in the (N+1)th period so as to filter out the portion of the audio signal received in the (N+1)th period, in which the anti-noise data includes several signals inversive to the audio signals in the sound data.

According to one embodiment of the present disclosure, the control module further includes an output module electrically coupled to the control module. The output module is configured to output an unfiltered portion of the audio signal received in the (N+1)th period.

Another aspect of the present disclosure is to provide a sound processing method for processing several audio signals received in several periods. The sound processing method includes: storing the audio signals received from a first period to an Nth period as sound data, in which N is an integer larger than zero; comparing the audio signal received in an (N+1)th period with the sound data so as to generate a relevance value; and filtering out a portion of the audio signal received in the (N+1)th period when the relevance value is smaller than a threshold value, in which the portion of the audio signal received in the (N+1)th period is relevant to the sound data.

According to one embodiment of the present disclosure, the sound processing method further includes: adding the audio signal received in the (N+1)th period into the sound data when the relevance value is larger than or equal to the threshold value.

According to one embodiment of the present disclosure, the step of when the relevance value is larger than or equal to the threshold value further includes: deleting the audio signal received in an earliest period in the sound data.

According to one embodiment of the present disclosure, the step of filtering out the portion of the audio signal received in the (N+1)th period when the relevance value is smaller than the threshold value includes: generating an anti-noise data, in which the anti-noise data includes several signals inversive to the audio signals in the sound data; and superimposing a ratio of the anti-noise data onto the audio signal received in the (N+1)th period.

As illustrated from the aforementioned embodiments of the present disclosure, by comparing a current audio signal with past audio signals to generate a relevance value and a determination is made as to whether the currently received audio signal is the background audio signal according to whether the relevance value is larger than or equal to the threshold value. If a determination is made as to that the currently received audio signal is the background audio signal (e.g., if the relevance value is larger than or equal to the threshold value), the past-received audio signals are updated. Accordingly, it is unnecessary for the anti-noise headset device to previously build noise data corresponding to the various environments, and the use of the anti-noise headset device is not limited by a specific occasion. In other words, the anti-noise headset device can isolate the user from noise in various environments. Furthermore, if a determination is made as to that the currently received audio signal includes other audio signals besides the background audio signal (e.g., if the relevance value is smaller than the threshold value), a portion of the currently received audio signal relevant to the background audio signal is filtered out and an unfiltered portion of the currently received audio signal is outputted to the user. Therefore, the user still can immediately receive important audio signals (e.g., alarm, voice, etc.) when the user is isolated from the background noise. Accordingly, the use of the anti-noise headset device is more flexible and secure.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
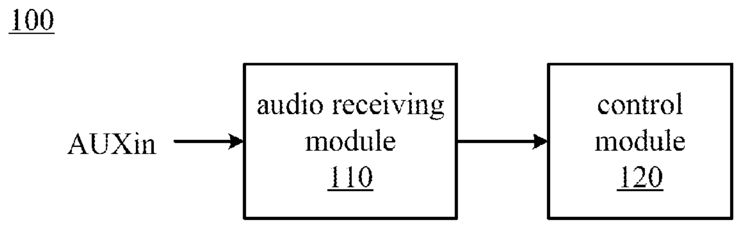
FIG. 1 is a block diagram illustrating an anti-noise headset device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a block diagram illustrating an anti-noise headset device 100 according to one embodiment of the present disclosure. The anti-noise headset device 10 includes an audio receiving module 110 and a control module 120. The audio receiving module 110 is configured to receive outer audio signals. In one embodiment, the audio receiving module 110 includes at least one microphone (not shown in the figure) disposed in the anti-noise headset device 100. Therefore, the anti-noise headset device 100 can receive the environmental audio signals around the anti-noise headset device 100.

The control module 120 is electrically coupled to the audio receiving module 110 and is configured to analyze and compare the audio signals AUXin received by the audio receiving module 110 so as to determine whether the currently received audio signal is the environmental noise signal or not. Specifically, the control module 120 can divide the audio signals AUXin received by the audio receiving module 110 into several audio signals in several periods according to received time. In one embodiment, the control module 120 divides the audio signals received by the audio receiving module 110 from a first period to an Nth period into a first audio signal to an Nth audio signal. N is an integer larger than zero. The unit of each period is equivalent.

Next, the control module 120 stores the first audio signal to the Nth audio signal as sound data. The sound data is configured to determine whether the audio signal AUXin received by the audio receiving module 110 is background audio signal or not. Specifically, when the anti-noise headset device 100 is enabled, the audio signals received by the audio receiving module 110 in a beginning period are probably background audio signals. Therefore, the control module 120 may regard the audio signals AUXin received by the audio receiving module 110 in the beginning period (e.g., a first period to an Nth period) as a reference for the background audio signal, and stores the audio signals in the beginning period as the sound data.

Then, the control module 120 compares a currently received audio signal AUXin (e.g., an (N+1)th audio signal received in an (N+1) the period) with the sound data so as to generate a relevance value. The control module 120 may determine whether the (N+1)th audio signal is the background audio signal according to whether the relevance value is smaller than a predetermined threshold value or not.

If the relevance value is smaller than the threshold value, it represents that the currently received audio signal AUXin (e.g., the (N+1)th audio signal) is slightly relevant to audio signals in the sound data (e.g., the first audio signal to the Nth audio signal). In other words, the (N+1)th audio signal may include other audio signals besides the audio signals in the sound data. The other audio signals may include immediate alarm, voice, etc. Therefore, when the relevance value is smaller than the threshold value, the control module 120 determines that the (N+1)th audio signal includes the audio signals necessary for the user and filters out a portion of the (N+1)th audio signal. The portion of the (N+1)th audio signal is relevant to the sound data. Since the background audio signal keeps existing around the anti-noise headset device 100, the control module 120 can output an unfiltered portion of the (N+1)th audio signal to the user through an output device (e.g., a speaker, not shown in the figure) after the control module 120 filters out the background audio signals of the (N+1)th audio signal (i.e., filtering out the portion of the (N+1)th audio signal relevant to the sound data).

If the relevance value is larger than or equal to the threshold value, it represents that the currently received audio signal AUXin is significantly relevant to audio signals in the sound data (e.g., the first audio signal to the Nth audio signal). In other words, the difference between the (N+1)th audio signal and the former N audio signals is small. Therefore, when the relevance value is larger than or equal to the threshold value, the control module 120 determines that the (N+1)th audio signal is still the background audio signal.

In one embodiment, when the control module 120 determines that the currently received audio signal (e.g., the (N+1)th audio signal) is the background audio signal, the control module 120 adds the (N+1)th audio signal into the sound data. Moreover, the control module 120 may further delete an audio signal received in the earliest period in the sound data so as to update the sound data which is regarded as a reference for the background audio signal. In the present embodiment, the audio signal received in the earliest period in the sound data is the first audio signal. Next, if the audio receiving module 110 receives an (N+2)th audio signal in an (N+2)th period, the control modules 120 compares the (N+2)th audio signal with the updated sound data so as to generate the relevance value. Therefore, the control module 120 may determine whether the (N+2)th audio signal is the background audio signal according to the relevance value.

For example, the number of the audio signals stored in the sound data is supposed to be 50 (i.e., N=50) and a unit of each period is supposed to be 10 milliseconds (ms). When the anti-noise headset device 100 is enabled, the control module 120 stores 50 audio signals received by the audio receiving module 110 in beginning 500 milliseconds as sound data. Next, the control module 120 compares the audio signal received in a period between the 501th millisecond and the 510th millisecond (i.e., the 51th audio signal) with 50 audio signals in the sound data so as to generate the relevance value.

When the relevance value is smaller than the threshold value, the control module 120 filters out a portion of the 51th audio signal relevant to 50 audio signals in the sound data. When the relevance value is larger than or equal to the threshold value, the control module 120 stores the 51th audio signal into the sound data and deletes the 1st audio signal in the sound data. In other words, the updated sound data includes 2nd audio signal to 51th audio signal (i.e., audio signals received in a period between the 11th millisecond and the 510th millisecond).

Accordingly, the user can adaptively filter out the background audio signal (e.g., noise) and immediately receive the important sound (e.g., alarm, voice, etc.) through the anti-noise headset device 100. Moreover, types of noise which are filtered by the anti-noise headset device 100 are not limited by the environment.

Figure 2:
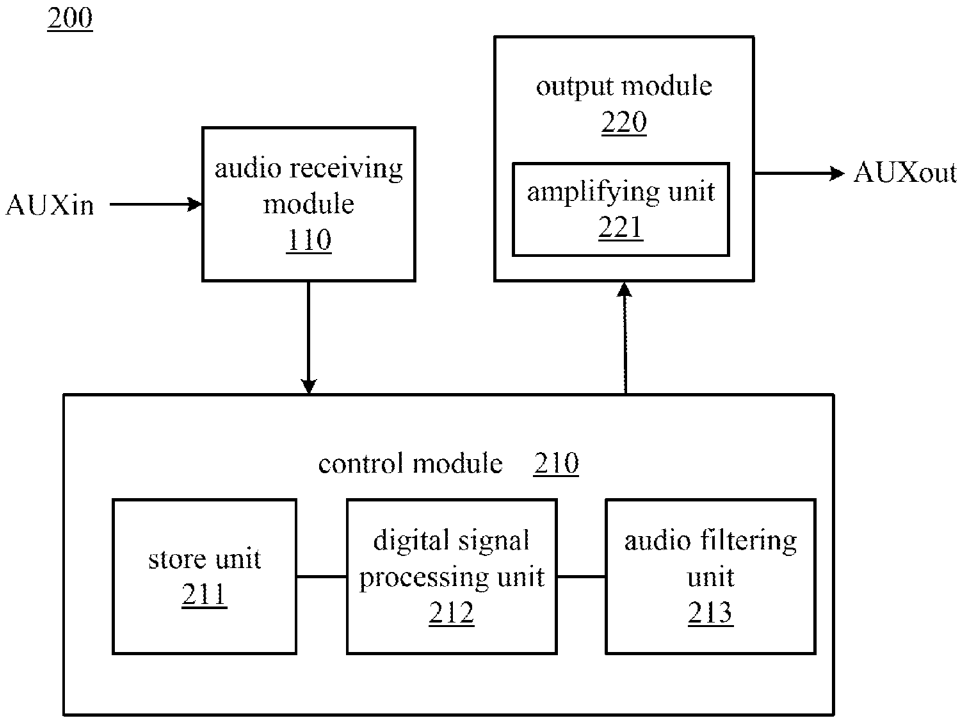
FIG. 2 is a block diagram illustrating an anti-noise headset device according to another embodiment of the present disclosure.

FIG. 2 is a block diagram illustrating an anti-noise headset device 200 according to another embodiment of the present disclosure. The anti-noise headset device 200 includes the sound receiving module 110, a control module 210 and an output module 220. In one embodiment, the control module 210 includes a store unit 211 and a digital signal processing module 212. The digital signal processing module 212 is electrically coupled to the store unit. The output module 220 is electrically coupled to the control module 210 and is configured to output the audio signal AUXout of which the background audio signal has been filtered out.

Specifically, the store unit 211 is configured to store the sound data. The digital signal processing unit 212 is configured to execute an audio characteristic analysis for the audio signals received by the audio receiving module 110 so as to obtain audio characteristics of the received audio signals. In one embodiment, the digital signal processing unit 212 executes frequency spectrum analysis for the audio signals received by the audio receiving module 110 so as to obtain spectral data of the received audio signals. Spectral data includes amplitudes and phases of the received audio signals in each frequency. Furthermore, frequency spectrum analysis is configured to transform the audio signals in time domain into the audio signals in frequency domain through Fourier transform so as to obtain spectral data of the audio signals.

Specifically, the digital signal processing unit 212 can receive spectral data of the audio signals received by the audio receiving module 110 through Fourier transform. Next, the digital signal processing unit 212 stores spectral data of the first audio signal received in the first period to spectral data of the Nth audio signal received in Nth period as sound data. Then, the digital signal processing unit 212 compares spectral data of the (N+1)th audio signal received in the (N+1)th period with N spectral data stored in the sound data (e.g., comparing the amplitude and the phase of spectral data of the (N+1) audio signal with the amplitudes and the phases of spectral data of N audio signals stored in the sound data) and generates N similar values. The digital signal processing unit 212 may multiply each similar value by a weight and adds all multiplied similar values to generate the relevance value.

Next, the digital signal processing unit 212 compares the relevance value with the threshold value so as determine whether the currently received audio signal is the background audio signal or not. The threshold value can be set up according to user's demand. Accordingly, the volume of the background noise filtered by the anti-noise headset device 200 can be adjusted according to the environment.

In one embodiment, the control module 210 further includes an audio filtering unit 213. The audio filtering unit 213 is electrically coupled to the digital signal processing unit 212. The audio filtering unit 213 is configured to generate anti-noise data which is inversive to the sound data and to superimpose a ratio of the anti-noise data onto the currently received audio signal (e.g., the (N+1)th audio signal). Therefore, a portion of the (N+1)th audio signal relevant to the sound data can be filtered out.

Specifically, the anti-noise data includes N signals of which waves are inversive to waves of N audio signals in the sound data. Accordingly, when the audio filtering unit 213 superimposes the anti-noise data onto the (N+1)th audio signal, the portion of the (N+1)th audio signal relevant to the sound data is offset by the anti-noise data. The user can adjust the amplitudes of the signals of the anti-noise data according to a proportion so that the volume of the filtered background noise can be adjusted.

In one embodiment, the output module 200 includes an amplifying unit 221. The amplifying unit 221 is configured to amplify the audio signal of which noise has been filtered out according to a proportion and outputs the amplified audio signal to the user. In one embodiment, the output module 220 includes a speaker.

Figure 3:
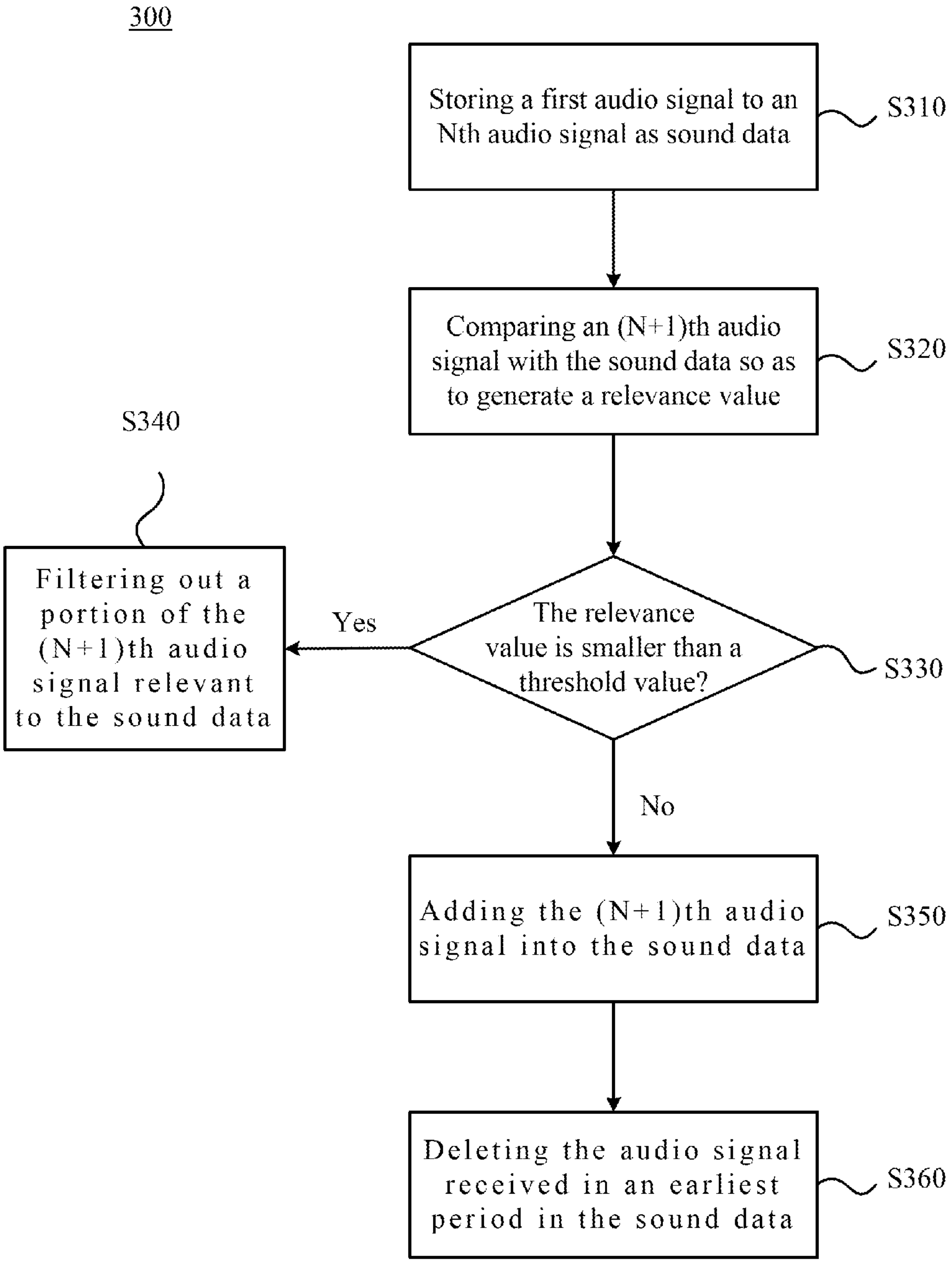
FIG. 3 is a flow chart illustrating an audio processing method according to one embodiment of the present disclosure.

FIG. 3 is a flow chart illustrating a sound processing method 300 according to one embodiment of the present disclosure. In order to clearly describe the present embodiment, the sound processing method 300 is described with the anti-noise headset device 200 of FIG. 2, but the present disclosure is not limited thereto.

First, audio signals are received by the audio receiving module 110. Next, in operation S310, a first audio signal received in a first period to an Nth audio signal received in an Nth period are stored as sound data by the digital signal processing unit 212. The sound data is stored in the store unit 211. N is an integer larger than zero.

Furthermore, when the audio receiving module 110 receives the audio signals, the digital signal processing unit 212 executes an audio characteristic analysis (e.g., frequency spectrum analysis) so as to obtain characteristics of the audio signals (e.g., spectral data). The digital signal processing unit 212 stores the characteristic of the first audio signal to the characteristic of the Nth audio signal as the sound data.

Next, in operation S320, the characteristic of the current audio signal (e.g., an (N+1)th audio signal received in an (N+1)th period) received by the audio receiving module 110 is compared with each of the characteristics of the audio signals in the sound data by the digital signal processing unit 212 so as to generate a relevance value. Next, in operation S330, a determination is made as to whether the relevance value is smaller than a threshold value. When the relevance value is smaller than the threshold (i.e., a determination is made as to that the (N+1)th audio signal includes signal different from the background audio signal), the operation S340 is executed. In operation S340, a portion of the (N+1)th audio signal relevant to the sound data is filtered out by the audio filtering unit 213. The (N+1)th audio signal of which the portion relevant to the sound data has been filtered out is outputted to user by the output module 220.

In one operation, anti-noise data of which waves of signals are inversive to waves of the audio signals in the sound data is generated by the audio filtering unit 213. The anti-noise data is superimposed onto the (N+1)th audio signal so as to filter out the portion of the (N+1)th audio signal relevant to the sound data.

Moreover, when the relevance value is larger than or equal to the threshold value (i.e., a determination is made as to that the (N+1)th audio signal is the background audio signal), the operation S350 is executed. In the operation 350, the (N+1)th audio signal is added into the sound data by the digital signal processing unit 212. Next, in operation S360, the audio signal received in an earliest period (i.e., the first audio signal in the present embodiment) in the sound data is deleted by the digital signal processing unit 212. In other words, the audio signals in the sound data are updated through the operation S350 and the operation S360. Since the digital signal processing unit 212 has determined that the currently received audio signal is the background audio signal, the (N+1)th audio signal may not be outputted by the output module 220.

As illustrated from the aforementioned embodiments of the present disclosure, the present disclosure provides an anti-noise headset device configured for comparing a current audio signal with past audio signals and generating a relevance value. Therefore, the anti-noise headset device can determine whether the currently received audio signal is the background audio signal according to whether the relevance value is larger than or equal to the threshold value. If a determination is made as to that the currently received audio signal is the background audio signal (e.g., if the relevance value is larger than or equal to the threshold value), the past-received audio signals are updated. Accordingly, it is unnecessary for the anti-noise headset device to previously build noise data corresponding to the various environments, and the use of the anti-noise headset device is not limited by a specific occasion. In other words, the anti-noise headset device can isolate the user from noise in various environments. Furthermore, if a determination is made as to that the currently received audio signal includes other audio signals besides the background audio signal (e.g., if the relevance value is smaller than the threshold value), a portion of the currently received audio signal relevant to the background audio signal is filtered out and an unfiltered portion of the currently received audio signal is outputted to the user. Therefore, the user still can immediately receive important audio signals (e.g., alarm, voice, etc.) when the user is isolated from the background noise. Accordingly, the use of the anti-noise headset device is more flexible and secure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An anti-noise headset device, comprising:

an audio receiving module configured to receive a plurality of audio signals in a plurality of periods;

a control module electrically coupled to the audio receiving module, configured to store the audio signals received by the audio receiving module from a first period to an Nth period as sound data and to compare the audio signal received in an (N+1)th period with the sound data so as to generate a relevance value, wherein N is an integer larger than zero;

wherein when the relevance value is smaller than a threshold value, the control module filters out a portion of the audio signal received in the (N+1)th period, wherein the portion of the audio signal received in the (N+1)th period is relevant to the sound data, wherein when the relevance value is larger than or equal to the threshold value, the control module adds the audio signal received in the (N+1)th period into the sound data, wherein when the relevance value is larger than or equal to the threshold value, the control module deletes the audio signal received by the audio receiving module in an earliest period in the sound data.

2. The anti-noise headset device of claim 1, wherein the control module comprises:

a store unit; and a digital signal processing unit electrically coupled to the store unit, configured to execute an audio characteristic analysis for the audio signals received by the audio receiving module so as to obtain a plurality of audio characteristics of the audio signals;

wherein the digital signal processing unit stores the audio characteristics of the audio signals received from the first period to the Nth period as the sound data, stores the sound data in the store unit, and compares the audio characteristic of the audio signal received in the (N+1)th period with the sound data so as to generate the relevance value.

3. The anti-noise headset device of claim 2, wherein the control module further comprises an audio filtering unit electrically coupled to the digital signal processing unit, wherein the audio filtering unit is configured to generate anti-noise data and to superimpose a ratio of the anti-noise data onto the audio signal received in the (N+1)th period so as to filter out the portion of the audio signal received in the (N+1)th period, wherein the anti-noise data includes a plurality of signals inversive to the audio signals in the sound data.

4. The anti-noise headset device of claim 1, further comprises a output module electrically coupled to the control module, configured to output an unfiltered portion of the audio signal received in the (N+1)th period.

5. A sound processing method for processing a plurality of audio signals received in a plurality of periods, comprising:

storing the audio signals received from a first period to an Nth period as sound data, wherein N is an integer larger than zero;

comparing the audio signal received in an (N+1)th period with the sound data so as to generate a relevance value;

filtering out a portion of the audio signal received in the (N+1)th period when the relevance value is smaller than a threshold value, wherein the portion of the audio signal received in the (N+1)th period is relevant to the sound data; and when the relevance value is larger than or equal to the threshold value, adding the audio signal received in the (N+1)th period into the sound data, and further deleting the audio signal received in an earliest period in the sound data.

6. The sound processing method of claim 5, wherein the step of filtering out the portion of the audio signal received in the (N+1)th period when the relevance value is smaller than the threshold value comprises:

generating an anti-noise data, wherein the anti-noise data includes a plurality of signals inversive to the audio signals in the sound data; and superimposing a ratio of the anti-noise data onto the audio signal received in the (N+1)th period.

7. The anti-noise headset device of claim 1, wherein when the anti-noise headset device is enabled, the control module sets the audio signals received by the audio receiving module in a beginning period as a reference for a background audio signal, and stores the audio signals in the beginning period as the sound data, wherein the beginning period is from the first period to the Nth period.

8. The anti-noise headset device of claim 7, wherein when the relevance value is larger than or equal to the threshold value, the control module determines that the audio signal received in the (N+1)th period is the background audio signal.

9. The anti-noise headset device of claim 8, further comprising:

a output module electrically coupled to the control module, wherein when the audio signal received in the (N+1)th period is the background audio signal, the output module does not output the audio signal received in the (N+1)th period.

10. The anti-noise headset device of claim 7, wherein when the relevance value is smaller than the threshold value, the control module determines that the audio signal received in the (N+1)th period includes signal different from the background audio signal.

11. The sound processing method of claim 5, wherein storing the audio signals received from a first period to an Nth period as sound data comprises:

when an anti-noise headset device is enabled, setting the audio signals received by the anti-noise headset device in a beginning period as a reference for a background audio signal, and storing the audio signals in the beginning period as the sound data, wherein the beginning period is from the first period to the Nth period.

12. The sound processing method of claim 11, further comprising:

when the relevance value is larger than or equal to the threshold value, determining that the audio signal received in the (N+1)th period is the background audio signal.

13. The sound processing method of claim 12, further comprising:

when the (N+1)th audio signal is the background audio signal, the anti-noise headset device does not output the audio signal received in the (N+1)th period.

14. The sound processing method of claim 11, further comprising:

when the relevance value is smaller than the threshold value, the control module determines that the audio signal received in the (N+1)th period includes signal different from the background audio signal.

* * * * *